United States Patent
Kawada

(10) Patent No.: US 7,589,899 B2
(45) Date of Patent: Sep. 15, 2009

(54) LENS OPTICAL SYSTEM AND PHOTOELECTRIC ENCODER

(75) Inventor: Hiroaki Kawada, Kanagawa (JP)

(73) Assignee: Mitutoyo Corporation, Kawasaki (JP)

( * ) Notice: Subject to any disclaimer, the term of this patent is extended or adjusted under 35 U.S.C. 154(b) by 52 days.

(21) Appl. No.: 11/812,926

(22) Filed: Jun. 22, 2007

(65) Prior Publication Data
US 2007/0297069 A1 Dec. 27, 2007

(30) Foreign Application Priority Data
Jun. 23, 2006 (JP) .............................. 2006-174603

(51) Int. Cl.
G02B 27/10 (2006.01)
G02B 7/02 (2006.01)
(52) U.S. Cl. ........................ 359/625; 359/820; 359/663; 359/737
(58) Field of Classification Search ................. 359/663, 359/619–621, 625, 737, 626, 820
See application file for complete search history.

(56) References Cited

U.S. PATENT DOCUMENTS
6,822,799 B2 * 11/2004 Kitamura et al. ............ 359/622

FOREIGN PATENT DOCUMENTS

| EP | 0 490 171 A2 | 6/1992 |
|----|--------------|--------|
| EP | 0 502 340 A2 | 9/1992 |
| EP | 1 239 519 A2 | 9/2002 |
| JP | A 61-165711  | 7/1986 |
| JP | A 09-043508  | 2/1997 |

* cited by examiner

*Primary Examiner*—Evelyn A. Lester
(74) *Attorney, Agent, or Firm*—Oliff & Berridge, PLC

(57) ABSTRACT

The present invention provides: a lens optical system having a lens and a plastic block having two parallel planes, the plastic block being provided between the lens and a focal position of the lens to suppress a variation of a focal length due to a temperature change, and a photoelectric encoder including the lens optical system.

6 Claims, 4 Drawing Sheets

LENS OPTICAL SYSTEM AND PHOTOELECTRIC ENCODER

The present application is based on Japanese Patent Application No. 2006-174603 filed on Jun. 23, 2006, and the contents thereof are incorporated herein by reference.

BACKGROUND OF THE INVENTION

1. Technical Field

The present invention relates to a lens optical system and a photoelectric encoder. More particularly, the present invention relates to a lens optical system capable of relaxing a variation of a focal length of a plastic lens due to a temperature change and one-side and both-side telecentric optical systems containing the lens optical system which are suitable for a linear scale and various optical equipments. Furthermore, the present invention relates to a photoelectric encoder containing them.

2. Description of Related Art

As one of optical lenses used in the optical instrument, there is the lens that is made of plastics (hereinafter referred to as "plastic lens"). This plastic lens has advantages that this lens is relatively inexpensive and also an aspheric surface can be easily shaped. However, on the other hand, the plastic lens has a disadvantage that a variation of a focal position due to a temperature change is large.

As the main factor in the variation of the focal position, a change of a refractive index of the lens due to a temperature change and a change in lens curvature due to a thermal expansion can be listed. In other work explanation will be made by taking a plastic lens 10 as the biconvex spherical lens shown in FIG. 1 as an example. A relationship be a focal lend f and a refractive index n, lens curvatures $R_1$, $R_2$ on the incident side and the emergent side, and a lens thickness d is given by following Equation (1).

$$1/f = (n-1) \times \{(1/R_1) - (1/R_2) + \{(n-1)^2/n\} \times \{d/(R_1 \times R_2)\}\} \quad (1)$$

Normally the refractive index n decreases and also the lens cures R1, R2 increase when the temperature rises. Therefore, both changes act in the direction to lengthen a focal length f. In contrast, both changes act in the direction to shorten a focal length f when the temperature falls.

Also, normally a change of the refractive index of the plastic lens and a variation of the focal length f due to the thermal expansion are ten times or more those of a lens that is made of glass (hereinafter referred to as "glass lens"), and these changes have great influences on lens performance. For this reason, some measure to relax such influences need to be taken.

For example, in Reference 1, it is set forth that a variation of the focal position due to a change of the refractive index can be cancelled by employing the hybrid lens in which plural pieces of lenses such as a convex lens, a concave lens, etc., whose lens profiles are different mutually, are aligned in combination.

[Reference 1] JP-A-943508

However, the hybrid lens set forth in Reference 1 has such a problem that an increase in cost and a difficulty of optical axis adjustment are caused due to an increase in the number of lenses.

SUMMARY OF THE INVENTION

The present invention provides a lens optical system and a photoelectric encoder making it possible to provide temperature compensation of a lens focal length at a minimum increase in cost with a relatively simple configuration.

In an embodiment of the present invention, in a lens optical system, a plastic block having two parallel planes is provided between a lens and a focal position of the lens to suppress a variation of a focal length due to a temperature change.

In an embodiment of the present invention, the plastic lens can be a lens array.

Also, in an embodiment of the present invention, a light shielding pattern can be formed on a surface of the plastic block.

Also, in an embodiment of the present invention, a lens optical system can be constructed as an one-side or both-side telecentric optical system containing the above lens optical system.

Also, in an embodiment of the present invention, a photoelectric encoder including the above lens optical system is provided.

According to the present invention, a variation of the lens focal length due to a temperature change can be suppressed at a minimum increase in cost with a relatively simple configuration.

Furthermore, other advantages and effects of the present invention will become apparent from the following description, drawings and claims.

BRIEF DESCRIPTION OF THE DRAWINGS

FIG. 3A is an optical path diagram explaining a variation of a focal position of a plastic lens due to a temperature change, and FIG. 3B is an optical path diagram explaining a variation of a focal position of a plastic block due to a temperature change.

DETAILED DESCRIPTION OF EXEMPLARY EMBODIMENTS OF THE INVENTION

Some embodiments of the present invention will be explained in detail with reference to the drawings hereinafter.

First Embodiment

Figure 1:
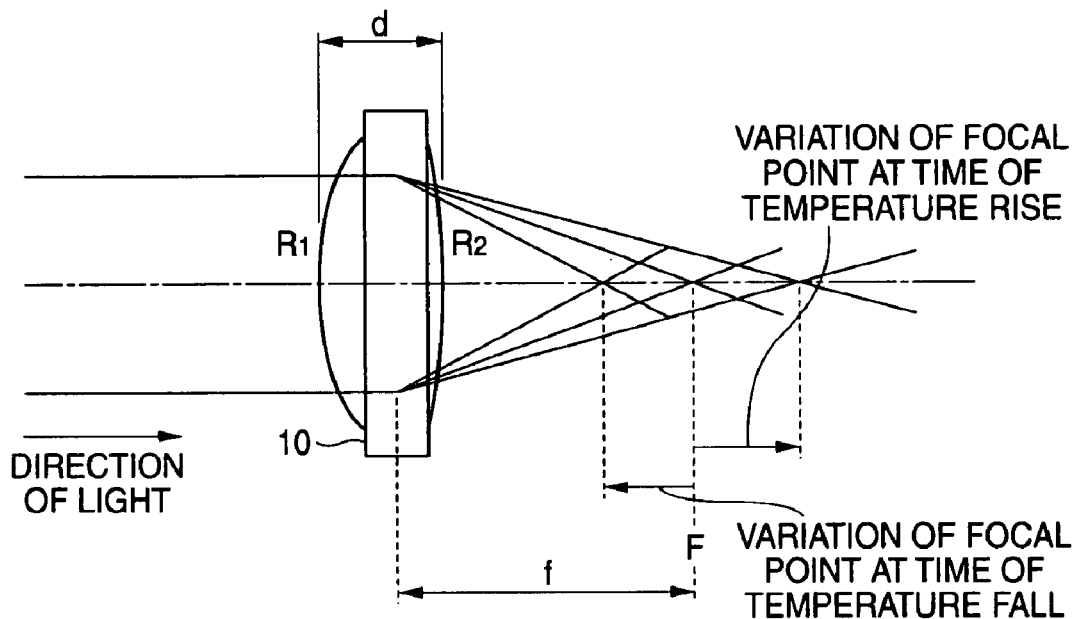
FIG. 1 is an optical path diagram explaining a variation of a focal position due to a temperature change.
Figure 2:
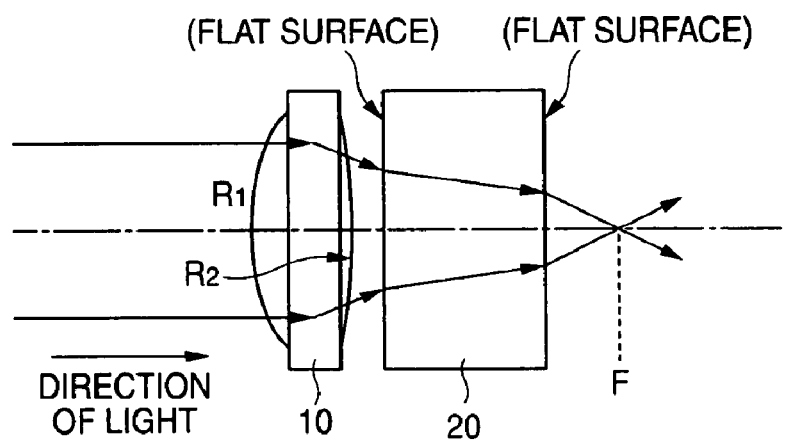
FIG. 2 is an optic path diagram showing a configuration of a first embodiment of the present invention.

As shown in FIG. 2, a first embodiment of the present invention is constructed in such a manner that for example, a plastic lens 10 as a biconvex spherical lens with lens curvatures $R_1$, $R_2$ and a block 20 made of plastics (herein referred to as a "plastic block") provided within a focal position F of the plastic lens and having two parallel flat surfaces to reduce a variation of a focal length caused due to a temperature change are provided.

The principle of temperature compensation for the focal length using the plastic block 20 is shown in FIG. 3.

Figure 3A:
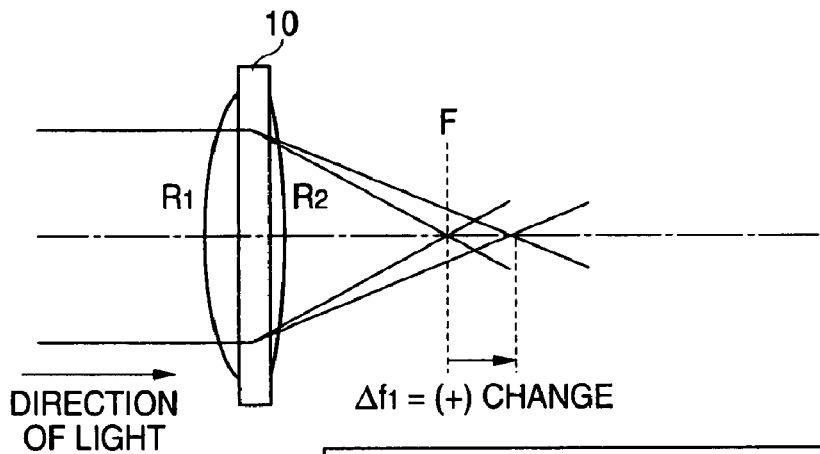
FIGS. 3A and 3B are drawings to explain the principle of the present invention.

As shown in FIG. 3A, a variation of focal length $\Delta f_1$ due to both a change in refractive index and a change in curvature of the plastic lens 10 at a time of temper rise gives a variation in the (+) direction, as given by following Equation (2).

$$\Delta f_1 = (+ \text{ change}) \quad (2)$$

Figure 3B:
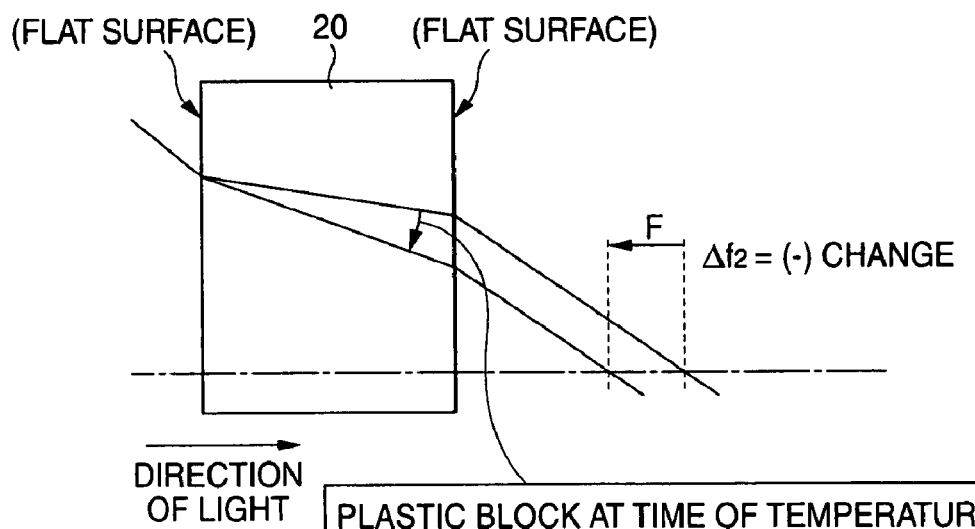

In contrast, as shown in FIG. 3B, a variation of focal length $\Delta f_2$ due to a change in refractive index of the plastic block 20 at a time of temperature rise gives a variation in the (−) direction, as given by following Equation (3).

$$\Delta f_2 = (- \text{ change}) \quad (3)$$

Accordingly, a variation of focal length $\Delta f$ of the lens optical system shown in FIG. 2 at a time of temperature rise is given by following Equation from Equations (2)(3). As a result, a variation caused by Equation (2) can be relaxed by a variation given by Equation (3).

$$\Delta f = \Delta f_1 - \Delta f_2 \quad (4)$$

In other words, since a change of refractive index of the plastic block 20, which is arranged between the plastic lens 10 and the focal position F and has two parallel planes, at a time of temperature change is utilized, temperature compensation of the focal position F of the plastic lens 10 can be made.

It is preferable that a dimension (thickness) and material of the plastic block 20 should be chosen to fit in with a dimension and material of the plastic lens 10 in such a way that a variation of focal length is brought in as close to $\Delta f = 0$ as possible. In this case, its compensation range may be set arbitrarily to meet the use. Here, there is no need that the same material as the plastic lens 10 should be used as the plastic block 20. Also, there is no need that the plastic block 20 should be arranged perpendicularly to an optical axis, and the plastic block 20 may be set at any angle to an optical axis.

Also, the biconvex spherical lens is illustrated in FIG. 2, but the type of the plastic lens 10 is not limited to this lens. Also, the plano-convex spherical lens, the biconvex aspheric lens, the plano-convex aspheric lens, and the like may be employed.

Second Embodiment

Next, a second embodiment of the present invention in which the plastic block and a light shielding function are rated will be explained hereunder.

Figure 4A:
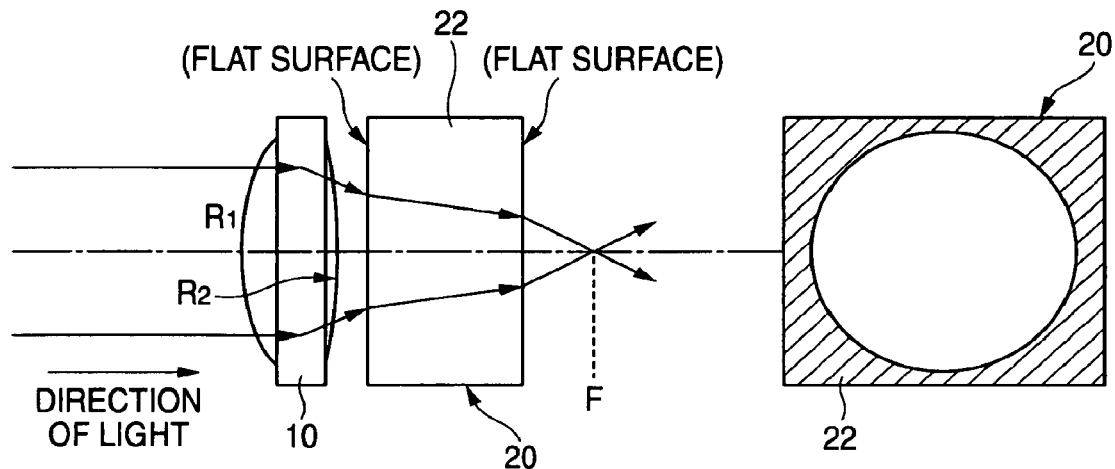
FIG. 4A is an optical path diagram showing a configuration of a second embodiment of the present invention, in which the plastic block and a light shielding function are integrated.
Figure 4B:
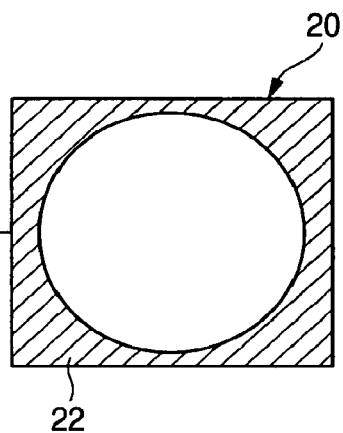
FIG. 4B is a side view thereof

As shown in FIG. 4A (optical path diagram) and FIG. 4B (side view of the plastic block), this second embodiment is constructed such that a light shielding pattern 22 made of silver, aluminum, or the like is formed on a surface of the plastic block 20 on the focal position F side to block a light incident from areas except an effective aperture of the plastic lens 10. Therefore, influences of aberrations caused by adding the plastic block 20 can be suppressed.

In FIGS. 4A and 4B, the light shielding pattern 22 is formed only on one surface of the plastic block 20 on the focal position F side. However, a light shielding effect can be enhanced when the light shielding pattern is also formed on an opposite surface of the plastic block on the plastic lens 10 side and side ices of the plastic block.

Third Embodiment

Figure 5:
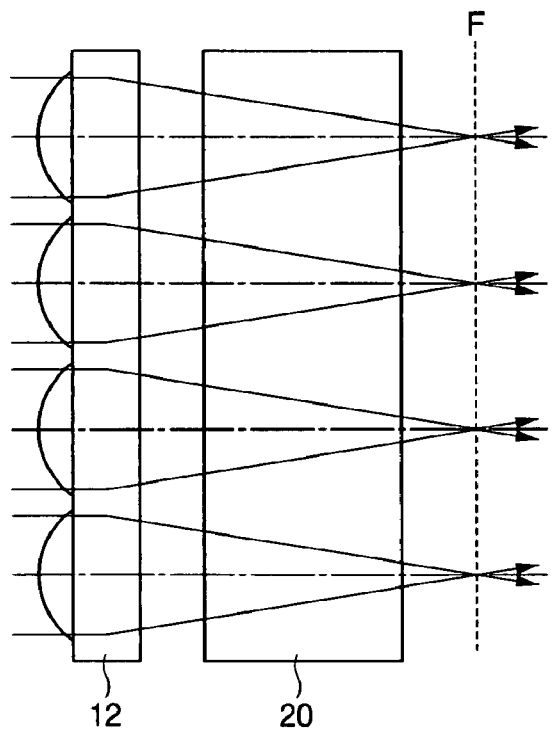
FIG. 5 is an optical path diagram showing a third embodiment of the present invention that is applied to a lens array.

Next, a third embodiment of the present invention in which the present invention is applied to the lens array is shown in FIG. 5.

In the present embodiment, the plastic block 20 having two parallel planes is arranged between a lens array 12 made of plastics (hereinafter referred to as a "plastic lens array") and the focal position F, and in a change of refractive index of the plastic block 20 at a time of temperature change is utilized. Therefore, temperature compensation of the focal position of the plastic lens array 12 can be made.

The principle of temperature compensation is similar to that of the first embodiment, and thus its detailed explanation will be omitted herein.

Fourth Embodiment

Figure 6:
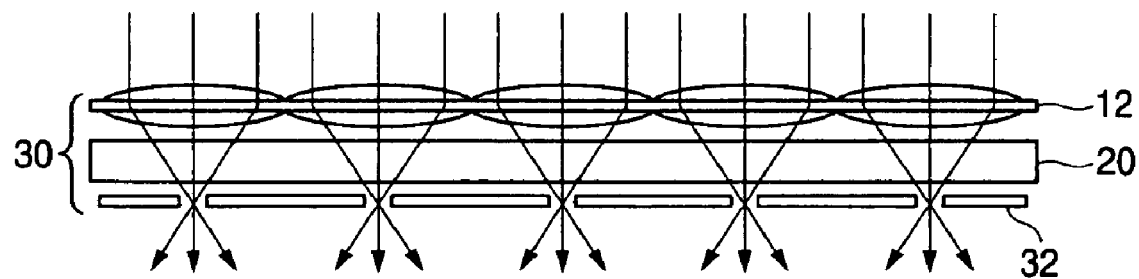
FIG. 6 is an optical path diagram showing a fourth embodiment of the present invention that is applied to a one-side telecentric optical system.

Next, a fourth embodiment of the present invention in which the lens array of the third embodiment is applied to an one-side telecentric optical system for image formation is shown in FIG. 6.

A one-side telecentric optical system 30 contains the plastic lens array 12 and the plastic block 20 similar to those of the third embodiment, and an aperture array 32 whose apertures are aligned in the focal positions of respective lenses of the plastic lens array 12.

A variation of focal length of respective lenses (12) links directly with a change of resolution in such imaging optical system (30). However, a change of resolution due to the temperature change can be relaxed by employing the lens array of the third embodiment.

Here, FIG. 6 shows the one-side telecentric optical system 30. But the lens array of the third embodiment may be applied similarly to a both-side telecentric optical system for image formation. Also, not only the lens array but also a single lens in any of the first to third embodiments may be applied similarly to the one-side telecentric optical system or both-side telecentric optical system for image formation.

Fifth Embodiment

Figure 7:
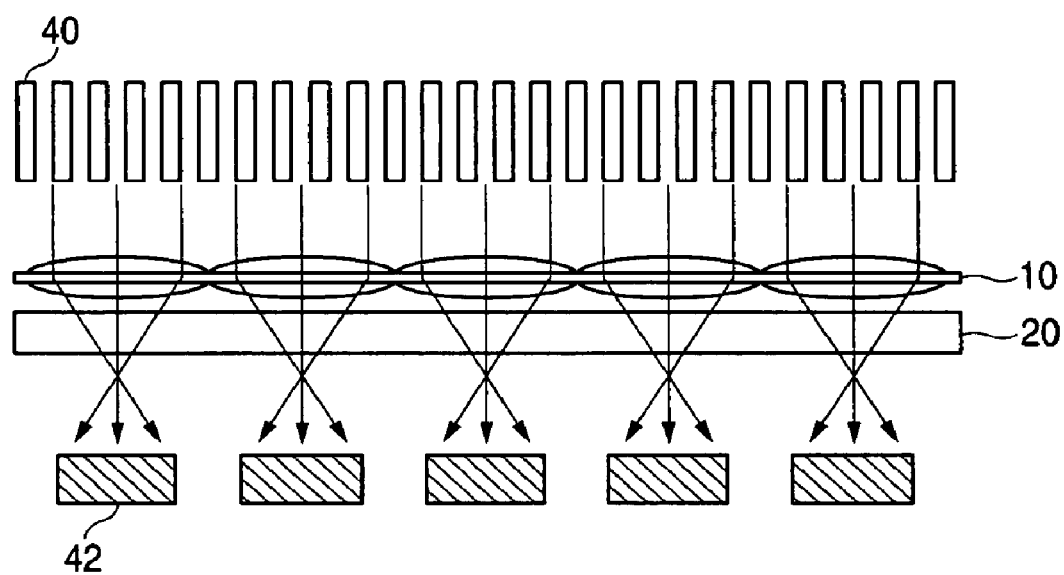
FIG. 7 is an optical path diagram showing a fifth embodiment of the present invention that is applied to a photoelectric encoder.

Next, a fifth embodiment of the present invention in which the lens array of the third embodiment is applied to a photoelectric encoder is shown in FIG. 7. In FIG. 7, 40 is a scale, and 42 is a light receiving array device.

When a focal position is varied due to the temperature change, an output of the encoder is deteriorated However, in the photoelectric encoder using the lens or the lens array according to the present invention, this deterioration can be reduced.

In the above embodiment, the present invention is applied to the plastic lens. But an object of application of the present invention is not limited to this mode. The present invention can be applied to overall lenses in which a variation of focal length due to a temperature change causes a problem.

While the present invention has been described in detail and with reference to specific embodiments thereof it will be apparent to one skilled in the art that various changes and modifications can be made therein without departing from the spirit and scope thereof.

What is claimed is:

1. A lens optical system comprising:
    a lens; and
    a plastic block having a thickness and two parallel planes, the plastic block being provided between the lens and a focal position of the lens and the plastic block being separate and at a distance from the lens, wherein
    when a temperature rises, a focal length of the lens is changed in a direction to lengthen and a refractive index of the plastic block is shortened, and
    a change of the refractive index of the plastic block suppresses a variation of the focal length of the lens due to a temperature increase.

2. The lens optical system comprising the lens optical system according to claim 1 and constituting an one-side telecentric optical system.

3. A photoelectric encoder comprising the lens optical system according to claim 1.

4. A lens optical system comprising:

a lens; and a plastic block having two parallel planes, the plastic block being provided between the lens and a focal position of the lens to suppress a variation of a focal length due to a temperature change, the plastic block being separate and at a distance from the lens, wherein the lens is a lens array.

5. A lens optical system comprising:

a lens; and a plastic block having two parallel planes, the plastic block being provided between the lens and a focal position of the lens to suppress a variation of a focal length due to a temperature change, wherein a light shielding pattern is formed on a surface of the plastic block.

6. A lens optical system comprising:

a lens; and a plastic block having two parallel planes, the plastic block being provided between the lens and a focal position of the lens to suppress a variation of a focal length due to a temperature change, wherein the lens optical system constitutes a both-side telecentric optical system.

* * * * *